(12) United States Patent
Kan et al.

(10) Patent No.: US 8,222,947 B2
(45) Date of Patent: Jul. 17, 2012

(54) LOW DISTORTION ACTIVE BALUN CIRCUIT AND METHOD THEREOF

(75) Inventors: Meng-Ping Kan, Hsinchu (TW); Sheng-Liang Liu, Changhua County (TW)

(73) Assignee: Rafael microelectronics, Inc., Hsinchu (TW)

( * ) Notice: Subject to any disclaimer, the term of this patent is extended or adjusted under 35 U.S.C. 154(b) by 333 days.

(21) Appl. No.: 12/690,118

(22) Filed: Jan. 20, 2010

(65) Prior Publication Data
US 2011/0175667 A1 Jul. 21, 2011

(51) Int. Cl.
*G06G 7/14* (2006.01)
*G06G 7/12* (2006.01)
(52) U.S. Cl. .......... 327/355; 327/361; 455/323
(58) Field of Classification Search .......... 330/301, 330/317, 311; 327/355–361; 455/323, 326
See application file for complete search history.

(56) References Cited

U.S. PATENT DOCUMENTS

| 7,332,960 B2* | 2/2008 | Burns et al. ......... 330/124 R |
| 7,944,310 B2* | 5/2011 | Chiu ................. 330/301 |
| 7,948,322 B2* | 5/2011 | Lee .................. 330/301 |

* cited by examiner

*Primary Examiner* — Dinh T. Le
(74) *Attorney, Agent, or Firm* — Winston Hsu; Scott Margo (57) ABSTRACT

A signal converting circuit includes: a first single-to-differential circuit arranged to generate a first signal having a first polarity and a second signal having a second polarity different from the first polarity; a second single-to-differential circuit arranged to generate a third signal having the second polarity and a fourth signal having the first polarity; and a combining circuit arranged to generate a first combined signal having the first polarity according at least two signals from the first signal, the second signal, the third signal, and the fourth signal, and output an output signal according to at least the first combined signal.

7 Claims, 8 Drawing Sheets

LOW DISTORTION ACTIVE BALUN CIRCUIT AND METHOD THEREOF

BACKGROUND OF THE INVENTION

1. Field of the Invention

The present invention relates to a signal converting circuit and method thereof, and more particularly to an active balun circuit for signal transformation between differential and single-end and a method thereof.

2. Description of the Prior Art

Figure 1:
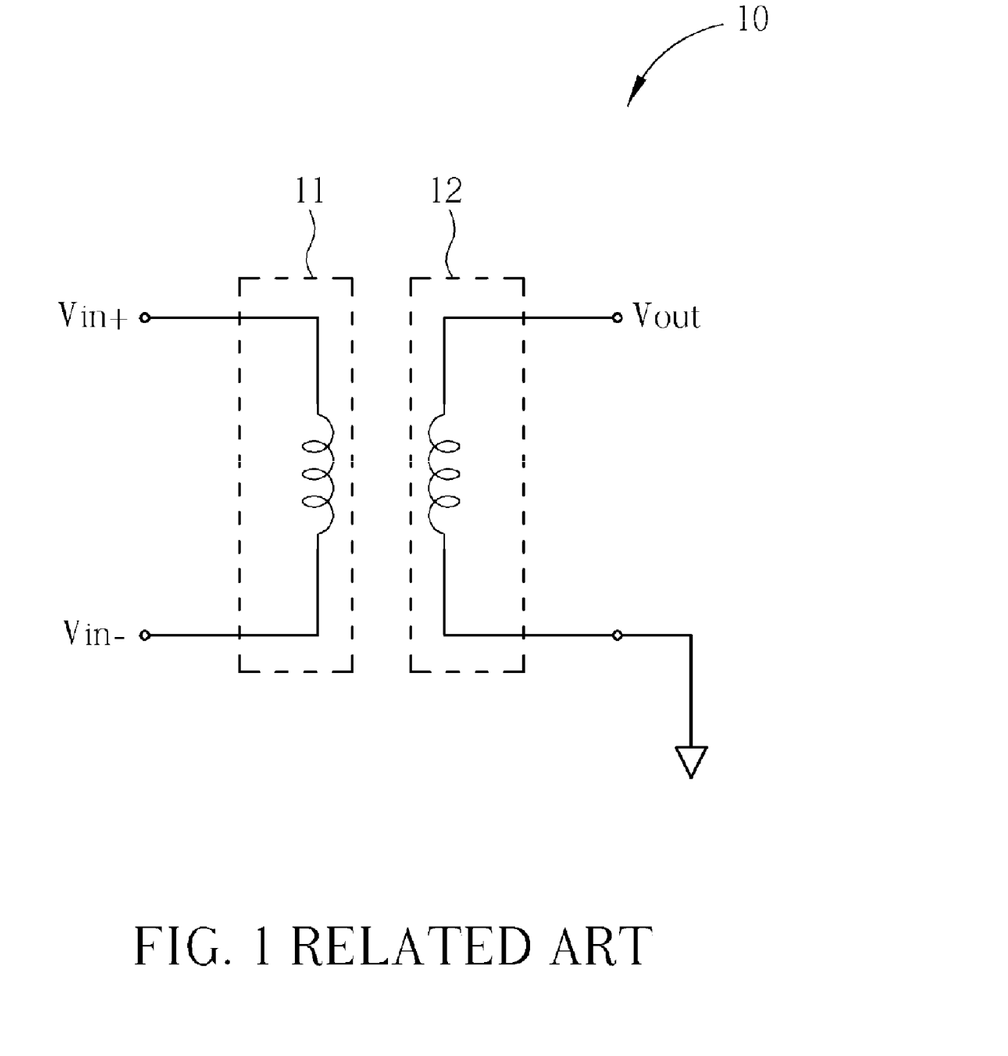
FIG. 1 is a diagram illustrating a conventional balun circuit.

A balun (Balance-unbalance) circuit is a transformer for transforming a single-end signal to a differential signal or transforming a differential signal to a single-end signal. Please refer to FIG. 1. FIG. 1 is a diagram illustrating a conventional balun circuit 10. The conventional balun circuit 10 is a passive balun circuit fabricated in two coils 11, 12 for transforming differential signals Vin+, Vin− to a single-end signal Vout. The differential signals Vin+, Vin− are applied to both ends of the primary coil 11 and the signal-end signal Vout is outputted from the first terminal of the secondary coil 12, wherein the second terminal of the secondary coil 12 is connected to a ground voltage.

Since the conventional balun circuit 10 is fabricated by two conducting coils, which is too bulky and difficult to implement into an integrated circuit. As for conventional active balun circuit, the poor $2^{nd}$ order linearity limits its applications. Therefore, how to provide a high linear, especially low 2nd order distortion and low cost balun circuit for an electronic device is a significant concern in the field.

SUMMARY OF THE INVENTION

One of the objectives of the present invention is therefore to provide a high linear and low cost active balun circuit for signal transformation between differential and single-end, and a method thereof.

According to a first embodiment of the present invention, a signal converting circuit is provided. The signal converting circuit comprises a first single-to-differential circuit, a second single-to-differential circuit, and a combining circuit. The first single-to-differential circuit is arranged to generate a first signal having a first polarity and a second signal having a second polarity different from the first polarity. The second single-to-differential circuit is arranged to generate a third signal having the second polarity and a fourth signal having the first polarity. The combining circuit is arranged to generate a first combined signal having the first polarity according at least two signals from the first signal, the second signal, the third signal, and the fourth signal, and output an output signal according to at least the first combined signal.

According to a second embodiment of the present invention, a signal converting method is provided. The signal converting method comprises the steps of: performing a first single-to-differential operation to generate a first signal having the a polarity and a second signal having a second polarity different from the first polarity; performing a second single-to-differential operation to generate a third signal having the second polarity and a fourth signal having the first polarity; and generating a first combined signal having the first polarity according at least two signals from the first signal, the second signal, the third signal, and the fourth signal, and outputting an output signal according to at least the first combined signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
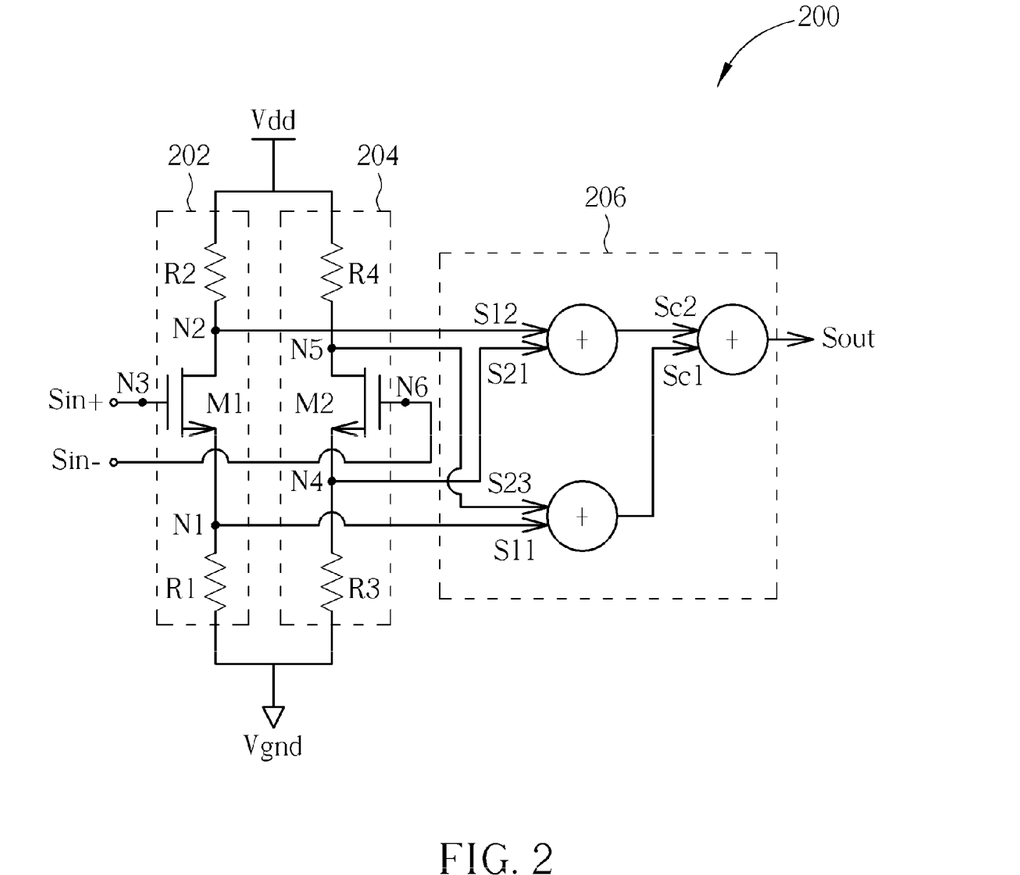
FIG. 2 is a diagram illustrating a signal converting circuit of the present invention

Please refer to FIG. 2. FIG. 2 is a diagram illustrating a signal converting circuit 200 of the present invention. The signal converting circuit 200 is an active balun circuit for converting differential signals Sin+, Sin− to a single-end output signal Sout, wherein the differential signals Sin+, Sin− comprise the first input signal Sin+ and the second input signal Sin−. The signal converting circuit 200 comprises a first single-to-differential circuit 202, a second single-to-differential circuit 204, and a combining circuit 206. The first single-to-differential circuit 202 is employed for converting the first input signal Sin+ having a first polarity (i.e. the positive) into a first signal S11 having the first polarity and a second signal S12 having a second polarity different from the first polarity. The second single-to-differential circuit 204 is employed for converting the second input signal Sin− having the second polarity (i.e. the negative) into a third signal S21 having the second polarity and a fourth signal S22 having the first polarity. The combining circuit 206 is coupled to the first single-to-differential circuit 202 and the second single-to-differential circuit 204 for combining the first signal S11 and the fourth signal S22 to generate a first combined signal Sc1 having the first polarity, and outputting the first combined signal Sc1 as the output signal Sout, or combining the second signal S12 and the third signal S21 to generate a second combined signal Sc2 having the second polarity, and outputting the second combined signal Sc2 as the output signal Sout, or combining the first combined signal Sc1 and the second combined signal Sc2 to generate a third combined signal Sc3 having the first polarity (or the second polarity), and outputting the third combined signal Sc3 as the output signal Sout. Please note that the first input signal Sin+ and the second input signal Sin− are specified as the positive input signal Sin+ and the negative input signal Sin− in the following descriptions for brevity.

According to an embodiment of the present invention, the first single-to-differential circuit 202 comprises a first N-type field effected transistor (FET) M1, a first resistor R1, and a second resistor R2, wherein the first resistor R1 is coupled between the source terminal N1 of the first N-type FET M1 and the ground voltage Vgnd, the second resistor R2 is coupled between the drain terminal N2 of the first N-type FET M1 and the supply voltage Vdd, and the gate terminal N3 of the first N-type FET M1 receives the positive input signal Sin+. In addition, the second single-to-differential circuit 204 comprises a second N-type FET M2, a third resistor R3, and a fourth resistor R4, wherein the third resistor R3 is coupled between the source terminal N4 of the second N-type FET M2 and the ground voltage Vgnd, the fourth resistor R4 is coupled between the drain terminal N5 of the second N-type FET M2 and the supply voltage Vdd, and the gate terminal N6 of the second N-type FET M2 receives the negative input signal Sin−.

Furthermore, the differential signals Sin+, Sin− are generated from a former stage coupled to the signal converting circuit 200, and therefore single and even order distortion (i.e., the common mode noise) from the former stage may exist in the differential signals Sin+, Sin−. For example, if the wanted signal in both the positive input signal Sin+ and the negative input signal Sin− is labeled as V and the single and even order distortion is labeled as x, then the positive input signal Sin+ may be expressed as V+x and the negative input signal Sin− may be expressed as −V+x. Since the first single-to-differential circuit 202 and the second single-to-differential circuit 204 may also induce even order distortion upon the differential signals Sin+, Sin−, the first signal S11, the second signal S12, the third signal S21, and the fourth signal S22 may be expressed as A(V+x)+d, −A(V+x)−d, A(−V+x)+d, and −A(−V+x)−d respectively, wherein A represents the gain (e.g., voltage gain) provided by each of the first single-to-differential circuit 202 and the second single-to-differential circuit 204, and d represents the even order distortion component induced by each of the first single-to-differential circuit 202 and the second single-to-differential circuit 204. Therefore, by summing up the first signal S11 and the fourth signal S22, or summing up the first signal S11 and the fourth signal S22, the single and even order distortion component x generated by the former stage and the even order distortion component d generated by the first single-to-differential circuit 202 and the second single-to-differential circuit 204 are cancelled, and the amplified wanted single-ended signal (i.e., 2AV or −2AV) is left. The output signal Sout can then be generated in accordance with the amplified wanted single-ended signal (i.e., 2AV or −2AV). Therefore, if the first combined signal Sc1 directly serves as the output signal Sout, the output signal Sout is 2AV, if the second combined signal Sc2 directly serves as the output signal Sout, the output signal Sout is −2AV, and if the third combined signal Sc3 serves as the output signal Sout, the output signal Sout may be 4AV or −4AV.

Figure 3:
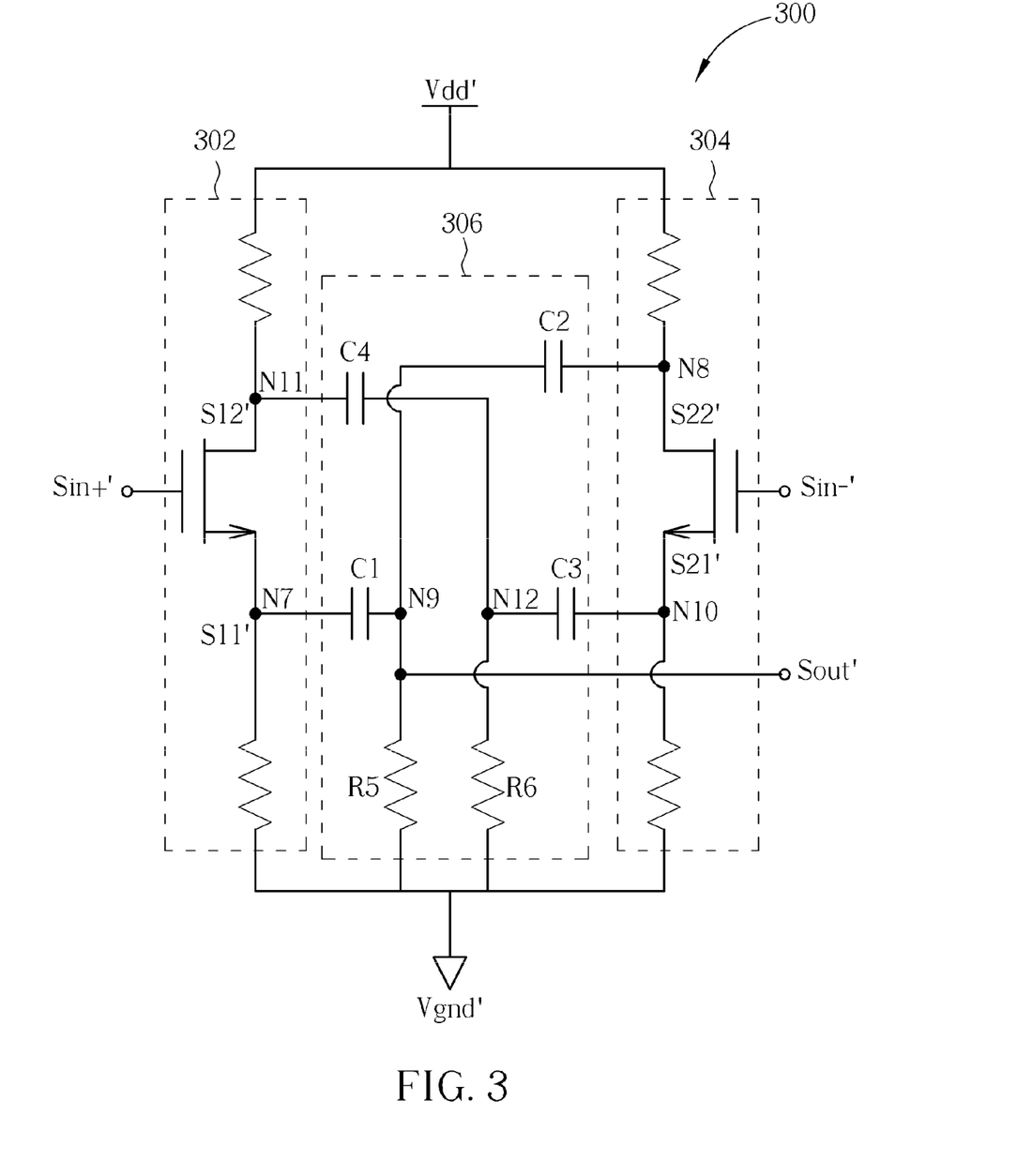
FIG. 3 is a diagram illustrating a signal converting circuit according to a first embodiment of the present invention.

Please refer to FIG. 3. FIG. 3 is a diagram illustrating a signal converting circuit 300 according to a first embodiment of the present invention, the signal converting circuit 300 comprises a first single-to-differential circuit 302, a second single-to-differential circuit 304, and a combining circuit 306. The signal converting circuit 200 is utilized to convert differential signals Sin+', Sin−' to a single-end output signal Sout'. The first single-to-differential circuit 302 and the second single-to-differential circuit 304 are similar to the first single-to-differential circuit 202 and the second single-to-differential circuit 204 respectively, and therefore the detailed description is omitted here for brevity. In this embodiment, the combining circuit 306 comprises a first capacitor C1, a second capacitor C2, a third capacitor C3, a fourth capacitor C4, a first resistor R5, and a second resistor R6. The first capacitor C1 has a first terminal N7 for receiving the first signal S11'. The second capacitor C2 has a first terminal N8 for receiving the fourth signal S22' and a second terminal N9 coupled to a second terminal of the first capacitor C1. The third capacitor C3 has a first terminal N10 for receiving the third signal S21'. The fourth capacitor C4 has a first terminal N11 for receiving the second signal S12' and a second terminal N12 coupled to a second terminal of the third capacitor C3. The first resistor R5 is coupled between the second terminal of the first capacitor C1 and the ground voltage Vgnd'. The second resistor R6 is coupled between the second terminal of the third capacitor C3 and the ground voltage Vgnd'. In this embodiment, the first capacitor C1, the second capacitor C2, and the first resistor R5 are configured to combine the first signal S11' and the fourth signal S22' to generate the output signal Sout'. Therefore, the output signal Sout' is outputted from the second terminal (i.e., N9) of the first capacitor C1. Furthermore, the third capacitor C3, the fourth capacitor C4, and the second resistor R6 are configured as the dummy device corresponding to the first capacitor C1, the second capacitor C2, and the first resistor R5 respectively such that the differential signals Sin+', Sin−' may have the same electrical characteristic (e.g., input impedance). More specifically, the third capacitor C3 and the fourth capacitor C4 are dummy capacitors, and the second resistor R6 is a dummy resistor.

According to the signal converting circuit 300, the first capacitor C1 and the second capacitor C2 directly sum up the first signal S11' and the fourth signal S22' to generate the output signal Sout' at the first terminal (i.e., N9) of the first resistor R5, thus the single and even order distortion components generated by the former stage, and the even order distortion component generated by the first single-to-differential circuit 302 and the second single-to-differential circuit 304 are cancelled as described in the above-mentioned disclosure. Then, the amplified wanted signal (i.e., 2AV or −2AV) is left in the output signal Sout'.

Please note that the third capacitor C3, the fourth capacitor C4, and the second resistor R6 in the combining circuit 306 are limited as the dummy device. In another embodiment, the third capacitor C3, the fourth capacitor C4, and the second resistor R6 may be configured to combine the third signal S21' and the second signal S12' to generate another output signal having the opposite polarity to the polarity of the output signal Sout'.

Figure 4:
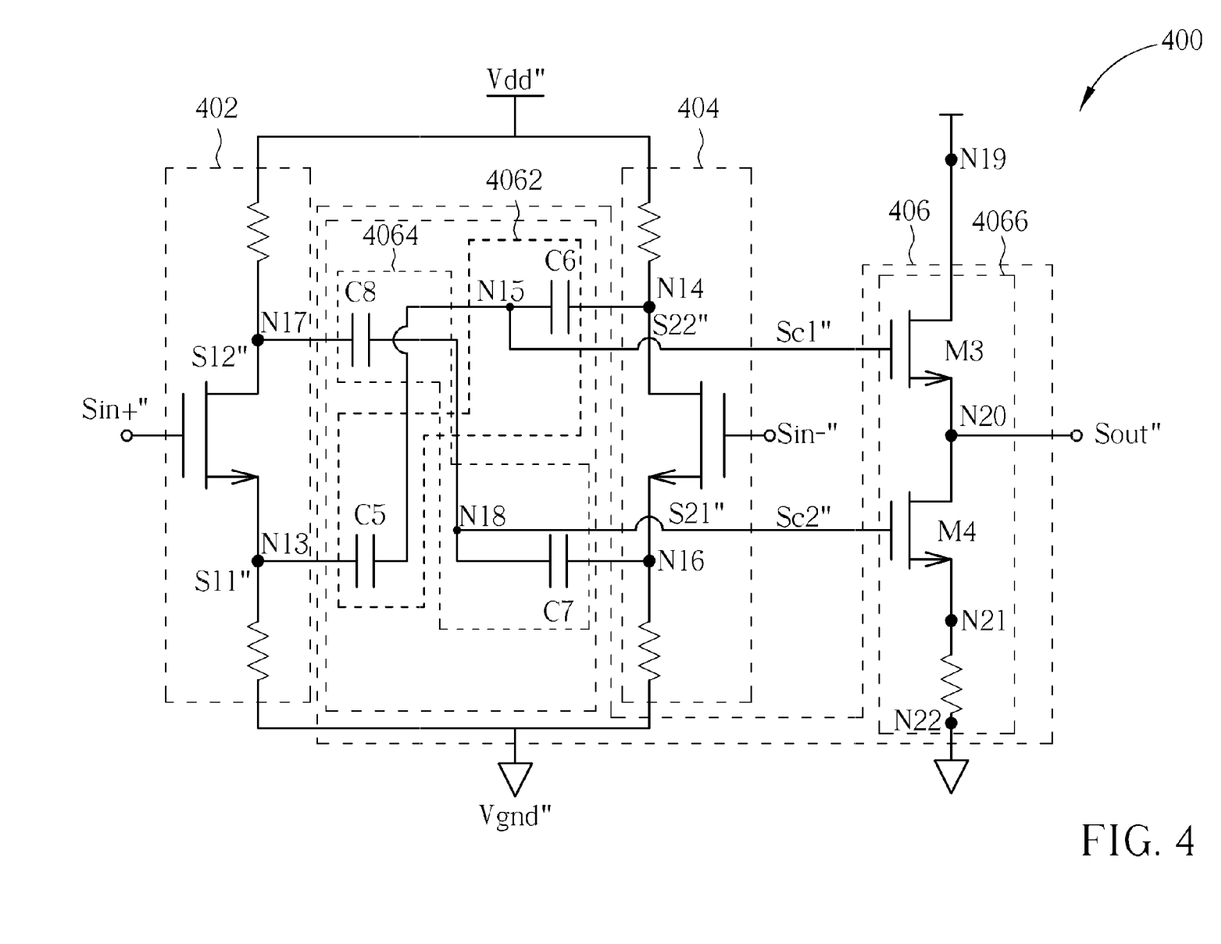
FIG. 4 is a diagram illustrating a signal converting circuit according to a second embodiment of the present invention.

Please refer to FIG. 4. FIG. 4 is a diagram illustrating a signal converting circuit 400 according to a second embodiment of the present invention. The signal converting circuit 400 comprises a first single-to-differential circuit 402, a second single-to-differential circuit 404, and a combining circuit 406. The signal converting circuit 400 is utilized to convert differential signals Sin+", Sin−" to a single-end output signal Sout". The first single-to-differential circuit 402 and the second single-to-differential circuit 404 are similar to the first single-to-differential circuit 202 and the second single-to-differential circuit 204 respectively, thus the detailed description is omitted here for brevity. In this embodiment, the combining circuit 406 comprises a first adding circuit 4062, a second adding circuit 4064, and a third adding circuit 4066. The first adding circuit 4062 comprises a first capacitor C5 having a first terminal N13 for receiving the first signal S11", a second capacitor C6 having a first terminal N14 for receiving the fourth signal S22" and a second terminal N15 coupled to the second terminal of the first capacitor C5, wherein the first combined signal Sc1' is outputted from the second terminal (i.e., N15) of the first capacitor C5. The second adding circuit 4064 comprises a third capacitor C7 having a first terminal N16 for receiving the third signal S21", a fourth capacitor C8 having a first terminal N17 for receiving the second signal S12" and a second terminal N18 coupled to the second terminal of the third capacitor C7, wherein the second combined signal Sc2" is outputted from the second terminal (i.e., N18) of the third capacitor C7.

The third adding circuit 4066 is coupled to the first adding circuit 4062 and the second adding circuit 4064 for generating the output signal Sout' according to the first combined signal Sc1" and the second combined signal Sc2". The third adding circuit 4066 comprises: a first N-type FET M3 having a control terminal (i.e., gate) coupled to the second terminal (i.e., N15) of the first capacitor C5, and a first output terminal (i.e., drain) N19 coupled to the supply voltage Vdd"; a second N-type FET M4 having a control terminal coupled to the second terminal (i.e., N18) of the third capacitor C7, and a first output terminal N20 coupled to a second output terminal (i.e., source) of the first N-type FET M3, wherein the output signal Sout' is outputted from the second output terminal of the first N-type FET M3; and a resistor R7 having a first terminal coupled to a second output terminal N21 of the second N-type FET M4, and a second terminal N22 coupled to the ground voltage Vgnd".

According to the signal converting circuit 400, the first capacitor C5 and the second capacitor C6 directly sum up the first signal S11" and the fourth signal S22" to generate the first combined signal Sc1" (i.e., 2AV or −2AV) at the gate (i.e., N15) of the first N-type FET M3, and the third capacitor C7 and the fourth capacitor C8 directly sum up the third signal S21" and the second signal 512" to generate the second combined signal Sc2" (i.e., 2AV or −2AV) at the gate (i.e., N18) of the second N-type FET M4, thus the single and even order distortion component generated by the former stage, and the even order distortion component generated by the first single-to-differential circuit 402 and the second single-to-differential circuit 404 are cancelled as described in the above-mentioned disclosure. Then, a high linear analog adder, i.e., the third adding circuit 4066, is employed to sum up the first combined signal Sc1' and the second combined signal Sc2" to generate the output signal Sout'. Therefore, the output signal Sour with the amplified wanted signal of 4AV or −4AV is generated if the voltage gain performed upon the first combined signal Sc1" is approximately +1 and the voltage gain performed upon the second combined signal Sc2" is approximately −1.

Figure 5:
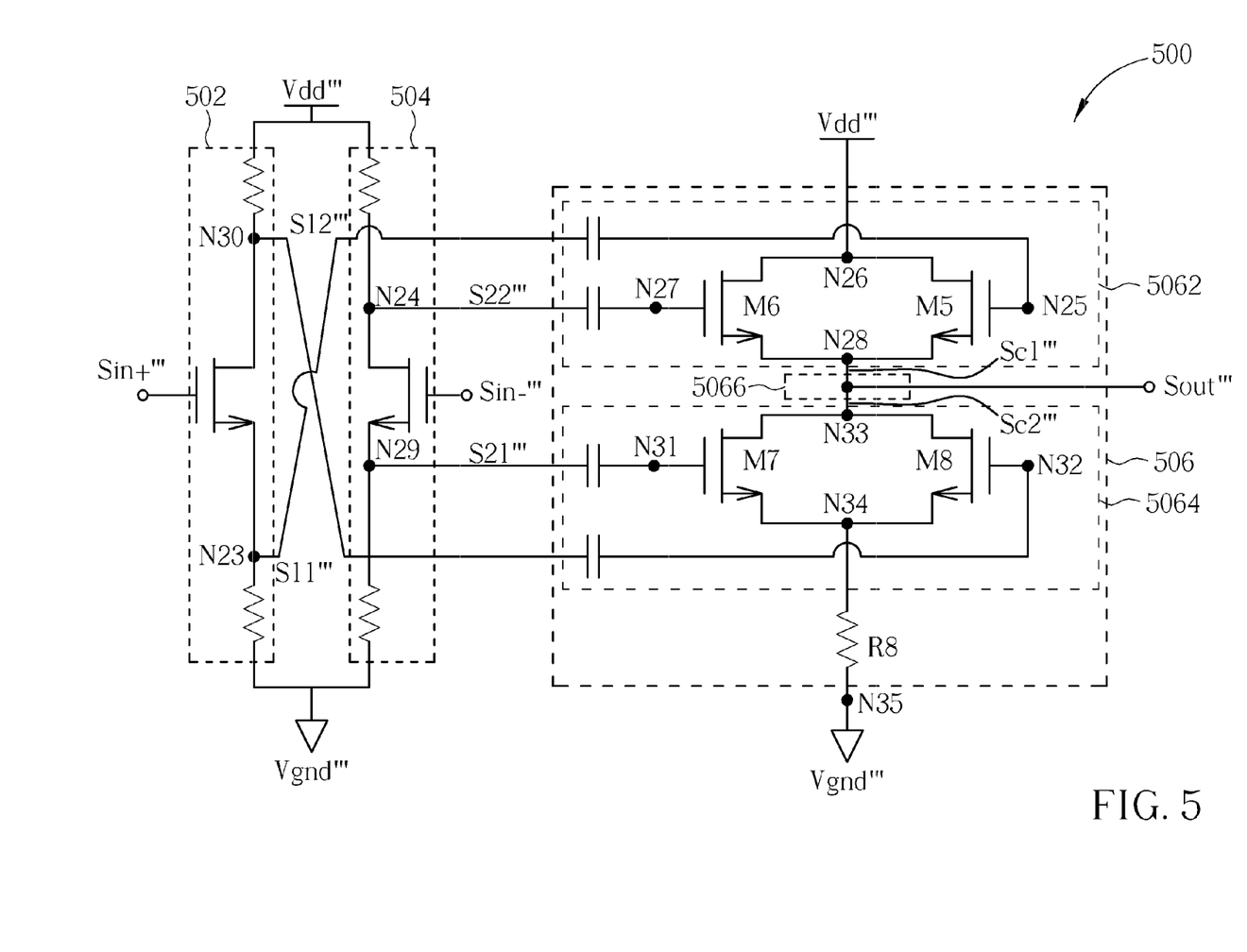
FIG. 5 is a diagram illustrating a signal converting circuit according to a third embodiment of the present invention.

Please refer to FIG. 5. FIG. 5 is a diagram illustrating a signal converting circuit 500 according to a third embodiment of the present invention. The signal converting circuit 500 comprises a first single-to-differential circuit 502, a second single-to-differential circuit 504, and a combining circuit 506. The signal converting circuit 500 is utilized to convert differential signals Sin+''', Sin−''' to a single-end output signal Sout'''. The first single-to-differential circuit 502 and the second single-to-differential circuit 504 are similar to the first single-to-differential circuit 202 and the second single-to-differential circuit 204 respectively, thus the detailed description is omitted here for brevity. In this embodiment, the combining circuit 506 comprises a first adding circuit 5062, a second adding circuit 5064, and a third adding circuit 5066. The first adding circuit 5062 comprises: a first capacitor C9 having a first terminal N23 for receiving the first signal S11'''; a second capacitor C10 having a first terminal N24 for receiving the fourth signal S22'''; a first N-type FET M5 having a control terminal N25 coupled to a second terminal of the first capacitor C9, and a first output terminal N26 coupled to the supply voltage Vdd'''; and a second N-type FET M6 having a control terminal N27 coupled to a second terminal of the second capacitor C10, a first output terminal coupled to the supply voltage Vdd''', and a second output terminal N28 coupled to a second output terminal of the first N-type FET M5, wherein the first combined signal Sc1''' is outputted from the second output terminal N28 of the second N-type FET M6. The second adding circuit 5064 comprises: a third capacitor C11 having a first terminal N29 for receiving the third signal 521'''; a fourth capacitor C12 having a first terminal N30 for receiving the second signal S12'''; a third N-type FET M7 having a control terminal N31 coupled to a second terminal of the third capacitor C11; and a fourth N-type FET M8 having a control terminal N32 coupled to a second terminal of the fourth capacitor C12, a first output terminal N33 coupled to a first output terminal of the third N-type FET M7, and a second output terminal N34 coupled to a second output terminal of the third N-type FET M7, wherein the second combined signal Sc2''' is outputted from the first output terminal N33 of the fourth N-type FET M8; and a resistor R8 having a first terminal coupled to the second output terminal (i.e., N34) of the fourth N-type FET M8, and a second terminal N35 coupled to the ground voltage Vgnd'''. The third adding circuit 5066, which is coupled to the second output terminal (i.e., N28) of the first N-type FET M5 and the first output terminal (i.e., N33) of the fourth N-type FET M8, generates the output signal Sout''' according to the first combined signal Sc1''' and the second combined signal Sc2'''. Please note that the third adding circuit 5066 is merely a conducting node connecting the second output terminal (i.e., N28) of the first N-type FET M5 and the first output terminal (i.e., N33) of the fourth N-type FET M8 in this embodiment, but this is not a limitation of the present invention.

According to the signal converting circuit 500, the first adding circuit 5062 sums up the first signal S11''' and the fourth signal S22''' to generate the first combined signal Sc1''' (i.e., 2AV or −2AV if the voltage gain of the first N-type FET M5 and the second N-type FET M6 are approximately +1) at the common source (i.e., N28) of the first N-type FET M5 and the second N-type FET M6, and the second adding circuit 5064 sums up the third signal S21''' and the second signal S12''' to generate the second combined signal Sc2''' (i.e., 2AV or −2AV if the voltage gain of the third N-type FET M7 and the fourth N-type FET M8 are approximately −1) at the common drain (i.e., N33) of the third N-type FET M7 and the fourth N-type FET M8, thus the single and even order distortion component generated by the former stage, and the even order distortion component generated by the first single-to-differential circuit 502 and the second single-to-differential circuit 504 are cancelled as described in the above-mentioned disclosure. Then, the first combined signal Sc1''' and the second combined signal Sc2''' are summed up by the conducting node, i.e., the third adding circuit 5066, to generate the output signal Sout'. Therefore, the output signal Sour with the amplified wanted signal of 4AV or −4AV is generated.

Figure 6:
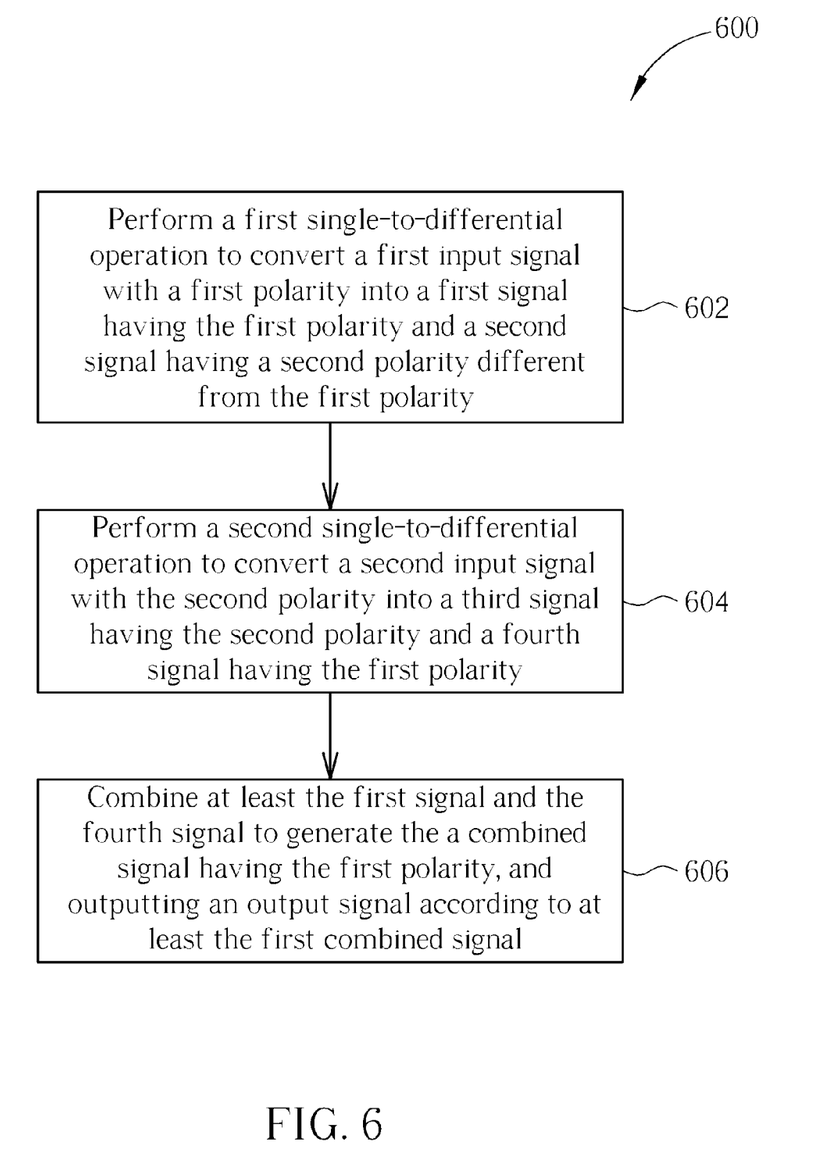
FIG. 6 is a flowchart illustrating a signal converting method according to a fourth embodiment of the present invention.

In general, the operation of the above mentioned embodiments 200, 300, 400, 500 may be summarized by a signal converting method 600 as shown in FIG. 6. FIG. 6 is a flowchart illustrating the signal converting method 600 according to an embodiment of the present invention. Provided that substantially the same result is achieved, the steps of the flowchart shown in FIG. 6 need not be in the exact order shown and need not be contiguous, that is, other steps can be intermediate. The signal converting method 600 comprises the following steps:

Step 602: Perform a first single-to-differential operation to convert the first input signal Sin+ having a first polarity into the first signal S11 having the first polarity and the second signal S12 having a second polarity different from the first polarity;

Step 604: Perform a second single-to-differential operation to convert the second input signal Sin− having the second polarity into a third signal S21 having the second polarity and a fourth signal S22 having the first polarity; and Step 606: Combine at least the first signal S11 and the fourth signal S22 to generate the first combined signal Sc1 having the first polarity, and output the output signal Sout according to at least the first combined signal Sc1.

In step 606, the output signal Sout may be generated by directly summing the first signal S11 and the fourth signal S22. By doing this, the single and even order distortion component generated by the former stage, and the even order distortion component generated in the first single-to-differential operation and the second single-to-differential operation are cancelled as described in the above mentioned embodiments. Similarly, in step 606, the output signal Sout may also be generated by combining the first combined signal Sc1 and the second combined signal Sc2, wherein the first combined signal Sc1 is the summation of the first signal S11 and the fourth signal S22, and the second combined signal Sc2 is the summation of the second signal S12 for generating the second combined signal Sc2.

Figure 7:
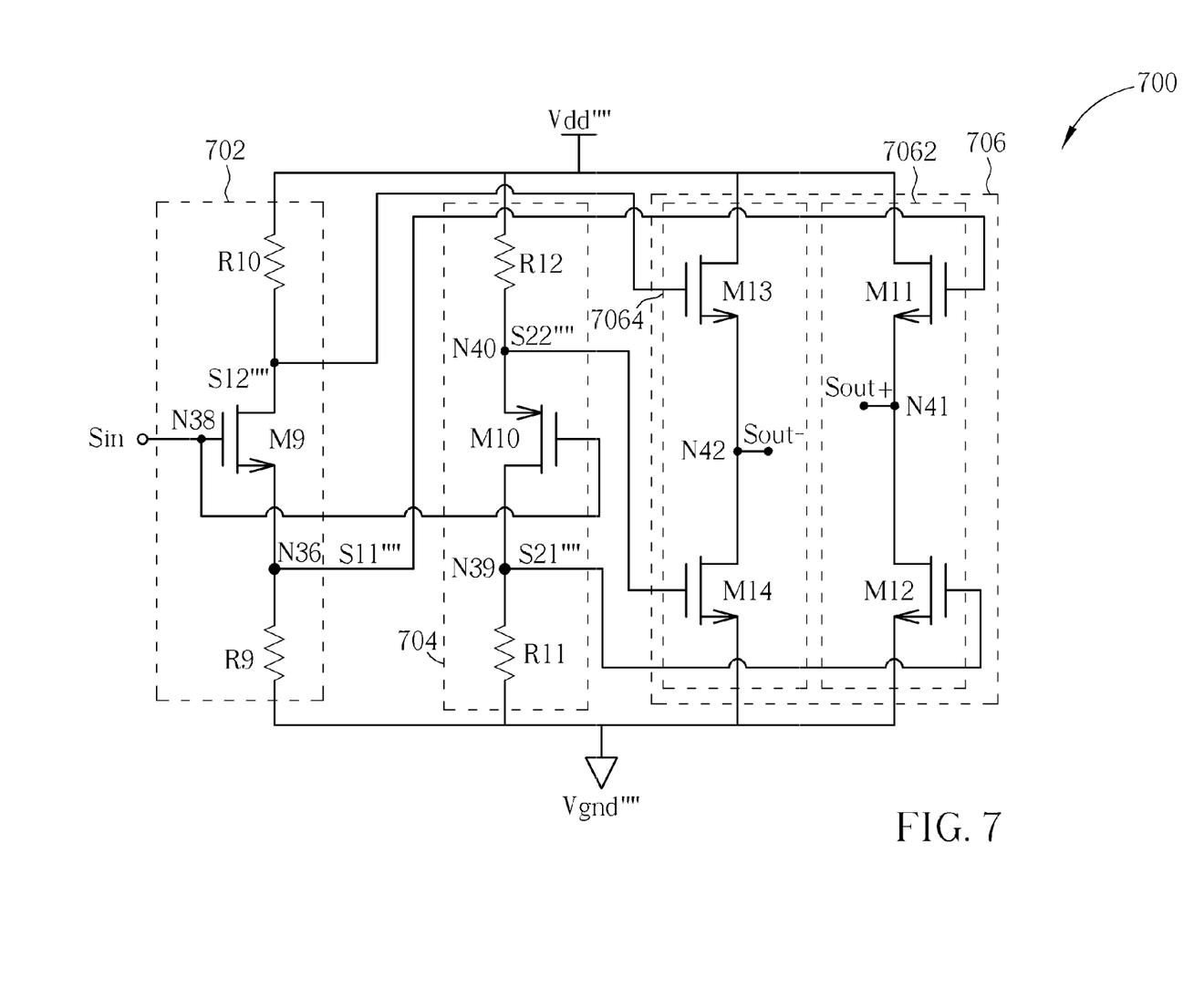
FIG. 7 is a diagram illustrating a signal converting circuit according to a fifth embodiment of the present invention.

Please refer to FIG. 7. FIG. 7 is a diagram illustrating a signal converting circuit 700 of the present invention. The signal converting circuit 700 is an active balun circuit for converting a single-end input signal Sin to a differential output signals Sout+, Sout−, wherein the differential output signals Sout+, Sout− comprise the first output signal Sout+ and the second output signal Sout−. The signal converting circuit 700 comprises a first single-to-differential circuit 702, a second single-to-differential circuit 704, and a combining circuit 706. The first single-to-differential circuit 702 is employed for converting the input signal Sin having a first polarity (i.e. the positive) into a first signal S11"" having the first polarity and a second signal S12"" having a second polarity (i.e. the negative) different from the first polarity. The second single-to-differential circuit 704 is employed for converting the input signal Sin into a third signal S21"" having the second polarity and a fourth signal S22"" having the first polarity. The combining circuit 706 is coupled to the first single-to-differential circuit 702 and the second single-to-differential circuit 704 for combining the first signal S11"" and the third signal S21"" to generate a first combined signal (i.e., the first output signal Sout+) having the first polarity, and for combining the second signal S12"" and the fourth signal S22"" to generate a second combined signal (i.e., the second output signal Sout−) having the second polarity. Then, the combining circuit 706 outputs the first combined signal and the second combined as the differential output signals Sout+, Sout−.

According to an embodiment of the present invention, the first single-to-differential circuit 702 comprises a N-type field effected transistor (FET) M9, a first resistor R9, and a second resistor R10, wherein the first resistor R9 is coupled between the source terminal N36 of the N-type FET M9 and the ground voltage Vgnd"", the second resistor R10 is coupled between the drain terminal N37 of the N-type FET M9 and the supply voltage Vdd"", and the gate terminal N38 of the N-type FET M9 receives the input signal Sin. In addition, the second single-to-differential circuit 704 comprises a P-type FET M10, a third resistor R11, and a fourth resistor R12, wherein the third resistor R11 is coupled between the source terminal N39 of the P-type FET M10 and the ground voltage Vgnd"", the fourth resistor R12 is coupled between the drain terminal N40 of the P-type FET M10 and the supply voltage Vdd"", and the gate terminal of the P-type FET M10 receives the input signal Sin.

In addition, the combining circuit 706 comprises a first subtracting circuit 7062 and a second subtracting circuit 7064. The first subtracting circuit 7062 comprises: an N-type FET M11 having a control terminal coupled to the source terminal N36 of the N-type FET M9, and a drain terminal coupled to the supply voltage Vdd""; and an N-type FET M12 having a control terminal coupled to the drain terminal N39 of the P-type FET M10, a source terminal coupled to the ground voltage Vgnd"", and a drain terminal N41 coupled to the drain terminal of the N-type FET M11, wherein the first output signal Sout+ is outputted from the terminal N41. The second subtracting circuit 7064 comprises: an N-type FET M13 having a control terminal coupled to the drain terminal N37 of the N-type FET M9, a drain terminal coupled to the supply voltage Vdd""; and an N-type FET M14 having a control terminal coupled to the source terminal N40 of the P-type FET M10, a source terminal coupled to the ground voltage Vgnd"", a drain terminal N42 coupled to the drain terminal of the N-type FET M13, wherein the second output signal Sout− is outputted from the terminal N42.

Please note that, when the wanted signal in the input signal Sin is labeled as Vs and even order distortion (e.g., second order inter-modulation distortion) generated by the first single-to-differential circuit 702 and the second single-to-differential circuit 704 is labeled as d, then the first signal S11"", the second signal S12"", the third signal S21"", and the fourth signal S22"" may be expressed as Vs+d, −Vs−d, −Vs+d, and Vs−d respectively. It is obvious that the polarity of the even order distortion in the first signal S11"" is the same to the polarity of the even order distortion in the third signal S21"" but the polarity of the wanted signal in the first signal S11"" is opposite to the polarity of the wanted signal in the third signal S21"", and the polarity of the even order distortion in the second signal S12"" is the same to the polarity of the even order distortion in the fourth signal S22"" but the polarity of the wanted signal in the second signal S12"" is opposite to the polarization polarity of the wanted signal in the fourth signal S22"". It should be noted that the gains provided by the first single-to-differential circuit 702 and the second single-to-differential circuit 704 are assumed as one for brevity. Therefore, the even order distortions in the first signal S11"" and the third signal S21"" can be cancelled by subtracting the third signal S21"" from the first signal S11"" meanwhile the wanted signals in the first signal S11"" and the third signal S21"" are doubled (i.e., Sout+=2Vs), and the even order distortions in the second signal S12"" and the fourth signal S22"" can be cancelled by subtracting the fourth signal S22"" from the second signal S12"" meanwhile the wanted signals in the first signal S11"" and the third signal S21"" are doubled (i.e., Sout−=−2Vs).

In this embodiment, the first subtracting circuit 7062 is arranged to subtract the third signal S21"" from the first signal S11"" to generate the first output signal Sout+. The second subtracting circuit 7064 is arranged to subtract the fourth signal S22"" from the second signal S12"" to generate the second output signal Sout−. In addition, it should be noted that, even the N-type FET M9 and the P-type FET M10 generate different even order distortions upon the input signal Sin, the proposed architecture still have the ability to reduce the even order distortions induced by the first single-to-differential circuit 702 and the second single-to-differential circuit 704.

Figure 8:
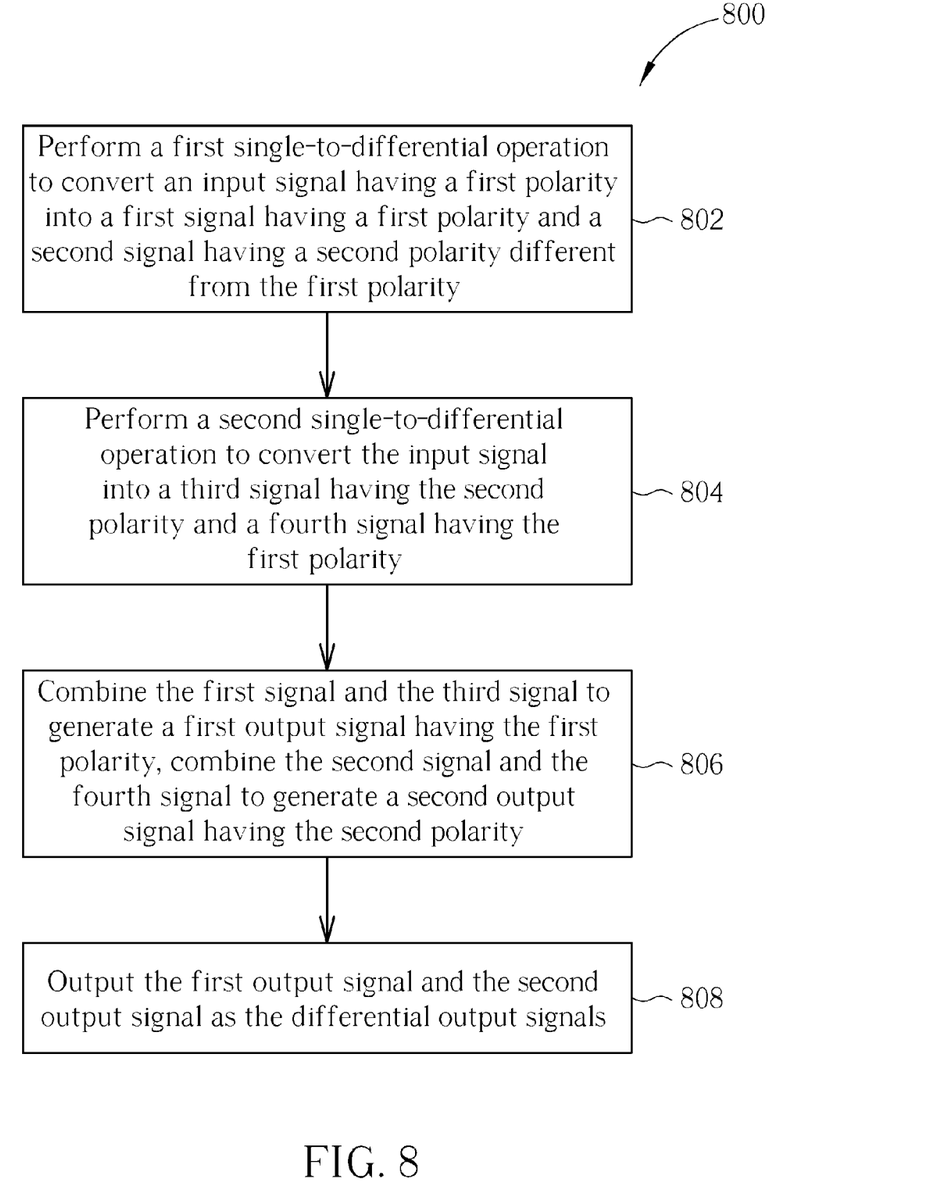
FIG. 8 is a flowchart illustrating the signal converting method according to a sixth embodiment of the present invention.

In addition, the operation of the above mentioned embodiment 800 may be summarized by a signal converting method 800 as shown in FIG. 8. FIG. 8 is a flowchart illustrating the signal converting method 800 according to an embodiment of the present invention. Provided that substantially the same result is achieved, the steps of the flowchart shown in FIG. 8 need not be in the exact order shown and need not be contiguous, that is, other steps can be intermediate. The signal converting method 800 comprises the following steps:

Step 802: Perform a first single-to-differential operation to convert the input signal Sin having a first polarity into the first signal S11"" having the first polarity and the second signal S12"" having a second polarity different from the first polarity;

Step 804: Perform a second single-to-differential operation to convert the input signal Sin into a third signal S21"" having the second polarity and a fourth signal S22"" having the first polarity;

Step 806: Combine the first signal S11"" and the third signal S21"" to generate the first output signal Sout+ having the first polarity, combine the second signal S12"" and the fourth signal S22"" to generate the second output signal Sout− having the second polarity; and Step 808: Output the first output signal Sout+ and the second output signal Sout− as the differential output signals Sout+, Sout−.

Briefly, the present embodiments 200, 300, 400, 500, 600 are concluded as the active balun circuit for converting the differential signals Sin+, Sin− to the single-end output signal Sout, in which the first signal S11 is summed up with the fourth signal S22, or the third signal S21 is summed up with the second signal S12 to cancel the single and even order distortion component x generated by the former stage, and the even order distortion component d generated by the first single-to-differential circuit 202 and the second single-to-differential circuit 204. The present embodiments 700, 800 are concluded as the active balun circuit for converting the single-end input signal Sin to the differential output signals Sout+, Sout−, in which the third signal S21"" is subtracted from the first signal S11"" for generating the first output signal Sout+, and the fourth signal S22"" is subtracted from the second signal S12"" for generating the second output signal Sout−. Furthermore, since the presented signal converting circuits are active balun circuits, they can be implemented into an integrated circuit to lower the cost of the electronic device employing the active balun circuit therein.

Those skilled in the art will readily observe that numerous modifications and alterations of the device and method may be made while retaining the teachings of the invention.

What is claimed is:

1. A signal converting circuit, for converting a first input signal and a second input signal into an output signal, comprising:
   a first single-to-differential circuit, arranged to generate a first signal having a first polarity and a second signal having a second polarity different from the first polarity;
   a second single-to-differential circuit, arranged to generate a third signal having the second polarity and a fourth signal having the first polarity; and
   a combining circuit, arranged to output the output signal according to at least a first combined signal having the first polarity, wherein the first combined signal is obtained according to at least two signals from the first signal, the second signal, the third signal, and the fourth signal;
   wherein the first single-to-differential circuit converts the first input signal having the first polarity into the first signal and the second signal; the second single-to-differential circuit, coupled to the first single-to-differential circuit, converts the second input signal having the second polarity into the third signal and the fourth signal; and the combining circuit, coupled to the first single-to-differential circuit and the second single-to-differential circuit, sums up the first signal and the fourth signal to generate the first combined signal directly serving as the output signal, and the combining circuit comprises:
      a first capacitor, having a first terminal for receiving the first signal;
      a second capacitor, having a first terminal for receiving the fourth signal and
         a second terminal coupled to a second terminal of the first capacitor; and
      a first resistor, coupled to the second terminal of the first capacitor;
   wherein the first combined signal is outputted from the second terminal of the first capacitor.

2. The signal converting circuit of claim 1, wherein the combining circuit further comprises:
   a third capacitor, having a first terminal for receiving the third signal;
   a fourth capacitor, having a first terminal for receiving the second signal and a second terminal coupled to a second terminal of the third capacitor; and
   a second resistor, coupled to the second terminal of the third capacitor;
   wherein the second resistor is a dummy resistor corresponding to the first resistor.

3. A signal converting circuit, for converting a first input signal and a second input signal into an output signal, comprising:
   a first single-to-differential circuit, arranged to generate a first signal having a first polarity and a second signal having a second polarity different from the first polarity;
   a second single-to-differential circuit, arranged to generate a third signal having the second polarity and a fourth signal having the first polarity; and
   a combining circuit, arranged to output the output signal according to at least a first combined signal having the first polarity, wherein the first combined signal is obtained according to at least two signals from the first signal, the second signal, the third signal, and the fourth signal;
   wherein the first single-to-differential circuit converts the first input signal having the first polarity into the first signal and the second signal; the second single-to-differential circuit, coupled to the first single-to-differential circuit, converts the second input signal having the second polarity into the third signal and the fourth signal; and the combining circuit, coupled to the first single-to-differential circuit and the second single-to-differential circuit, sums up the first signal and the fourth signal to generate the first combined signal, sums up the second signal and the third signal to generate a second combined signal having a second polarity, and sums up the first combined signal and the second combined signal to generate the output signal, and the combining circuit comprises:

a first adding circuit, comprising:
  a first capacitor, having a first terminal for receiving the first signal; and
  a second capacitor, having a first terminal for receiving the fourth signal and a second terminal coupled to a second terminal of the first capacitor, wherein the first combined signal is outputted from the second terminal of the first capacitor;
a second adding circuit, comprising:
  a third capacitor, having a first terminal for receiving the third signal; and
  a fourth capacitor, having a first terminal for receiving the second signal and a second terminal coupled to a second terminal of the third capacitor, wherein the second combined signal is outputted from the second terminal of the third capacitor; and
a third adding circuit, coupled to the first adding circuit and the second adding circuit, for generating the output signal according to the first combined signal and the second combined signal.

4. The signal converting circuit of claim 3, wherein the third adding circuit comprises:
  a first transistor, having a control terminal coupled to the second terminal of the first capacitor, and a first output terminal coupled to a first reference voltage;
  a second transistor, having a control terminal coupled to the second terminal of the third capacitor, and a first output terminal coupled to a second output terminal of the first transistor, wherein the output signal is outputted from the second output terminal of the first transistor; and
  a resistor, having a first terminal coupled to a second output terminal of the second transistor, and a second terminal coupled to a second reference voltage different from the first reference voltage.

5. A signal converting circuit, for converting a first input signal and a second input signal into an output signal, comprising:
  a first single-to-differential circuit, arranged to generate a first signal having a first polarity and a second signal having a second polarity different from the first polarity;
  a second single-to-differential circuit, arranged to generate a third signal having the second polarity and a fourth signal having the first polarity; and
  a combining circuit, arranged to output the output signal according to at least a first combined signal having the first polarity, wherein the first combined signal is obtained according to at least two signals from the first signal, the second signal, the third signal, and the fourth signal;
  wherein the first single-to-differential circuit converts the first input signal having the first polarity into the first signal and the second signal; the second single-to-differential circuit, coupled to the first single-to-differential circuit, converts the second input signal having the second polarity into the third signal and the fourth signal; and the combining circuit, coupled to the first single-to-differential circuit and the second single-to-differential circuit, sums up the first signal and the fourth signal to generate the first combined signal, sums up the second signal and the third signal to generate a second combined signal having a second polarity, and sums up the first combined signal and the second combined signal to generate the output signal, and the combining circuit comprises:
    a first adding circuit, comprising:
      a first capacitor, having a first terminal for receiving the first signal;
      a second capacitor, having a first terminal for receiving the fourth signal;
      a first transistor, having a control terminal coupled to a second terminal of the first capacitor, and a first output terminal coupled to a first reference voltage; and
      a second transistor, having a control terminal coupled to a second terminal of the second capacitor, a first output terminal coupled to the first reference voltage, and a second output terminal coupled to a second output terminal of the first transistor, wherein the first combined signal is outputted from the second output terminal of the second transistor;
    a second adding circuit, comprising:
      a third capacitor, having a first terminal for receiving the third signal;
      a fourth capacitor, having a first terminal for receiving the second signal;
      a third transistor, having a control terminal coupled to a second terminal of the third capacitor; and
      a fourth transistor, having a control terminal coupled to a second terminal of the fourth capacitor, a first output terminal coupled to a first output terminal of the third transistor, and a second output terminal coupled to a second output terminal of the third transistor, wherein the second combined signal is outputted from the first output terminal of the fourth transistor;
    a resistor, having a first terminal coupled to the second output terminal of the fourth transistor, and a second terminal coupled to a second reference voltage different from the first reference voltage; and
    a third adding circuit, coupled to the second output terminal of the first transistor and the first output terminal of the fourth transistor, for generating the output signal according to the first combined signal and the second combined signal.

6. A signal converting circuit, for converting an input signal into an output signal having a first combined signal and a second combined signal, comprising:
  a first single-to-differential circuit, arranged to generate a first signal having a first polarity and a second signal having a second polarity different from the first polarity;
  a second single-to-differential circuit, arranged to generate a third signal having the second polarity and a fourth signal having the first polarity; and
  a combining circuit, arranged to output the output signal according to at least the first combined signal having the first polarity, wherein the first combined signal is obtained according to at least two signals from the first signal, the second signal, the third signal, and the fourth signal;
  wherein the first single-to-differential circuit converts the input signal having the first polarity into the first signal and the second signal; the second single-to-differential circuit, coupled to the first single-to-differential circuit, converts the input signal into the third signal and the fourth signal; and the combining circuit, coupled to the first single-to-differential circuit and the second single-to-differential circuit, combines the first signal and the third signal to generate the first combined signal, and combines the second signal and the fourth signal to generate the second combined signal, the second combined signal has the second polarity, and the combining circuit comprises:

a first subtracting circuit, arranged to subtract the third signal from the first signal to generate the first combined signal; and a second subtracting circuit, arranged to subtract the fourth signal from the second signal to generate the second combined signal.

7. The signal converting circuit of claim 6, wherein the first subtracting circuit comprises:

a first transistor, having a control terminal for receiving the first signal, and a first output terminal coupled to a first reference voltage; and a second transistor, having a control terminal for receiving the third signal, a first output terminal coupled to a second reference voltage, and a second output terminal coupled to a second output terminal of the first transistor, wherein the first combined signal is outputted from the second output terminal of the second transistor; and the second subtracting circuit comprises:

a third transistor, having a control terminal for receiving the second signal, and a first output terminal coupled to the first reference voltage; and a fourth transistor, having a control terminal for receiving the fourth signal, a first output terminal coupled to the second reference voltage, and a second output terminal coupled to a second output terminal of the third transistor, wherein the second combined signal is outputted from the second output terminal of the fourth transistor.

* * * * *